(12) United States Patent
Lee (10) Patent No.: US 6,946,338 B2
(45) Date of Patent: Sep. 20, 2005

(54) METHOD FOR MANUFACTURING SEMICONDUCTOR DEVICE

(75) Inventor: Sang Don Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 10/742,397

(22) Filed: Dec. 22, 2003

(65) Prior Publication Data

US 2004/0180503 A1 Sep. 16, 2004

(30) Foreign Application Priority Data

Mar. 11, 2003 (KR) ................................ 10-2003-0015133

(51) Int. Cl.[7] .......................................... H01L 21/8238
(52) U.S. Cl. ........................ 438/217; 438/218; 438/405
(58) Field of Search ............................... 438/217, 218, 438/219, 221, 223, 224, 289, 405, 424

(56) References Cited

U.S. PATENT DOCUMENTS

| | | | |
|---|---|---|---|
| 5,571,738 A | | 11/1996 | Krivokapic |
| 5,726,479 A | * | 3/1998 | Matsumoto et al. ......... 257/412 |
| 5,843,820 A | * | 12/1998 | Lu ............................. 438/243 |
| 5,950,095 A | * | 9/1999 | Ko ............................. 438/443 |
| 6,083,795 A | * | 7/2000 | Liang et al. ................ 438/289 |
| 6,087,706 A | | 7/2000 | Dawson et al. |
| 6,172,402 B1 | | 1/2001 | Gardner et al. |
| 6,277,722 B1 | * | 8/2001 | Lee et al. ................... 438/592 |
| 2003/0006407 A1 | | 1/2003 | Taylor |
| 2003/0032261 A1 | * | 2/2003 | Yeh et al. ................... 438/451 |

FOREIGN PATENT DOCUMENTS

JP 06-151832 * 5/1994 ......... H01L/29/784

* cited by examiner

Primary Examiner—Amir Zarabian
Assistant Examiner—Pamela E Perkins
(74) Attorney, Agent, or Firm—Heller Ehrman LLP (57) ABSTRACT

The present invention discloses a method for manufacturing semiconductor device wherein a channel implant process of a transistor in a DRAM is performed in a self-aligned manner without using any mask. In accordance with the method, a device isolation film defining an active region on a semiconductor substrate. The device isolation film extrudes upward higher than the active region. The active region is subjected to a tilt ion implant process for implanting a impurity into the active region from two directions using the device isolation film as a mask so that a impurity concentration of the active region adjacent to the device isolation film is one half of that of the active region between the active region adjacent to the device isolation film. A stacked structure of a gate oxide film and a gate electrode are formed on the active region to complete the formation process of the semiconductor device.

18 Claims, 8 Drawing Sheets

METHOD FOR MANUFACTURING SEMICONDUCTOR DEVICE

BACKGROUND OF THE INVENTION

1. Field of the Invention

The present invention relates to method for manufacturing semiconductor device, and in particular to a method for manufacturing semiconductor device wherein a channel implant process of a transistor in a DRAM is performed in a self-aligned manner without using any mask to prevent misalignment and to improve a refresh characteristic of the DRAM.

2. Description of the Background Art

In accordance with a conventional method for manufacturing DRAM, only bit line contact region and a channel region of a cell transistor are subjected to a channel implant process using a channel implant mask in order to improve punch-through and data retention characteristics of the cell transistor.

FIGS. 1a through 1e are cross-sectional diagrams illustrating a conventional method for manufacturing semiconductor device comprising a channel implant process.

Figure 1A:
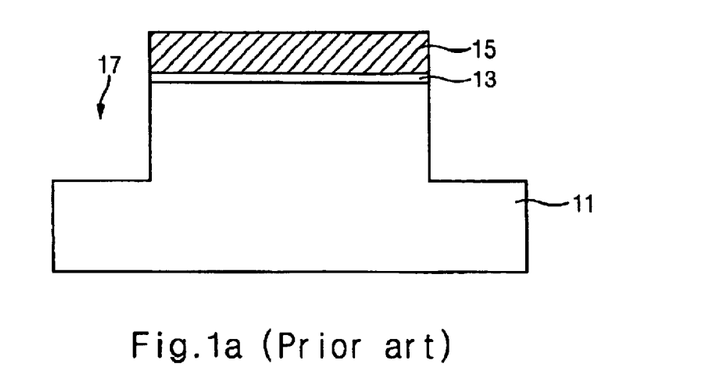
FIGS. 1a through 1e are cross-sectional diagrams illustrating a conventional method for manufacturing semiconductor device comprising a channel implant process.

Referring to FIG. 1a, a pad oxide film 13 and a pad nitride film 15 are sequentially formed on a semiconductor substrate 11 such as a silicon wafer.

The pad nitride film 15, the pad oxide film 11 and a predetermined thickness of the semiconductor substrate 11 are etched via a photoetching process using a device isolation film mask (not shown) to form a trench 17.

Figure 1B:
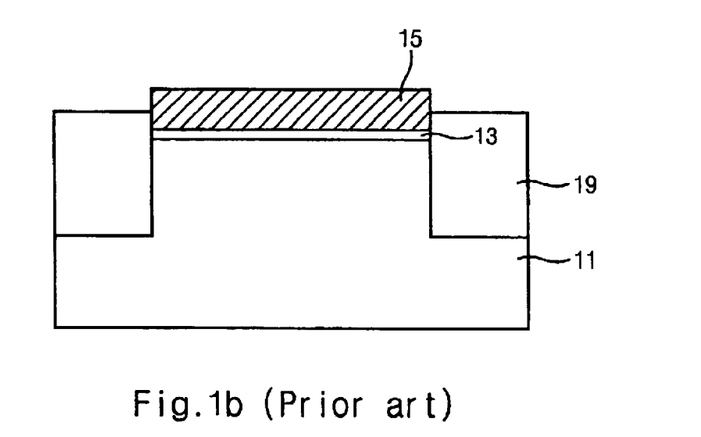

Now referring to FIG. 1b, a device isolation film 19 filling the trench 17 is formed. Preferably, the device isolation film 19 is formed by depositing an oxide film for device isolation film filling the trench 17 on the entire surface, and then planarizing and wet-etching the oxide film.

Figure 1C:
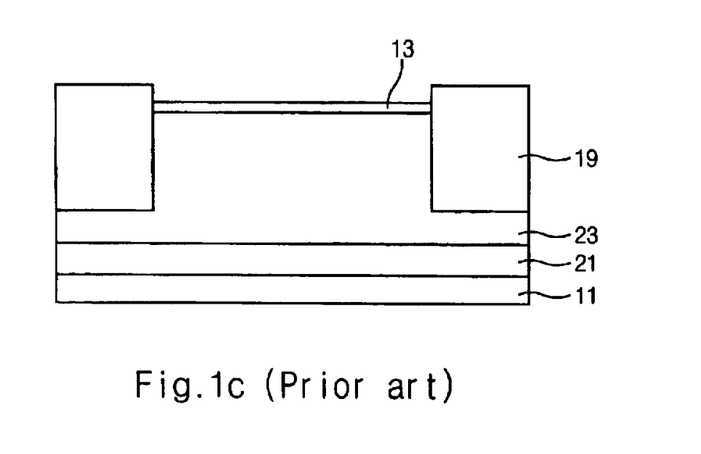

Referring to FIG. 1c, the pad nitride film 15 is removed preferably using phosphoric acid. A predetermined thickness of the device isolation film 19 is etched during the removal process of the pad nitride film 15.

Thereafter, a deep n-well 21 is formed via an implant process using an n-well mask (not shown). A p-well 23 is formed in the deep n-well 21 via an implant process using a p-well mask (not shown).

Figure 1D:
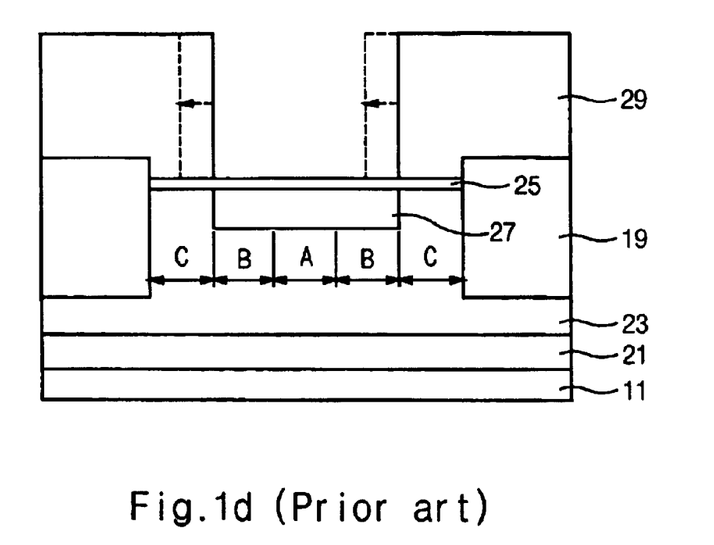

Referring to FIG. 1d, the pad oxide film 13 is removed to expose the semiconductor substrate 11. A buffer oxide film 25 is then formed on the exposed portion of the semiconductor substrate 11. Thereafter, a photoresist film pattern 29 is formed on the semiconductor substrate 11. The photoresist film pattern 29 is formed via an exposure and development process using a channel implant mask (not shown) to expose a bit line contact region A and a channel region B. The channel region B resides on both sides of the bit line contact region A. Each region has a width of 1F which is the minimum line width. A storage electrode contact region C resides adjacent to the channel region B. That is, the region A having a width of 1F resides in the center of the active region between the device isolation film 19 and the regions C having a width of 1F resides at both sides of region A and the region B having a width of 1F resides therebetween.

When the channel implant process is performed using the misaligned photoresist film pattern 29, which is shown as a dotted line in FIG. 1d, the impurity concentrations of the regions A, B and C differ from desired concentrations. The differences degrade the characteristic of the device.

For example, the concentration of impurity implanted in the partially exposed channel region is smaller than the desired concentration. This reduces the threshold voltage $V_t$ to induce a short channel effect. Moreover, when an impurity is implanted in the storage electrode contact region due to misalignment of the photoresist film pattern, the concentration of the storage electrode contact region where the impurity is implanted is higher than that of the storage electrode contact region where the impurity is not implanted. This increases the electric field, resulting in an increase in junction leakage current and degradation of data retention.

Figure 1E:
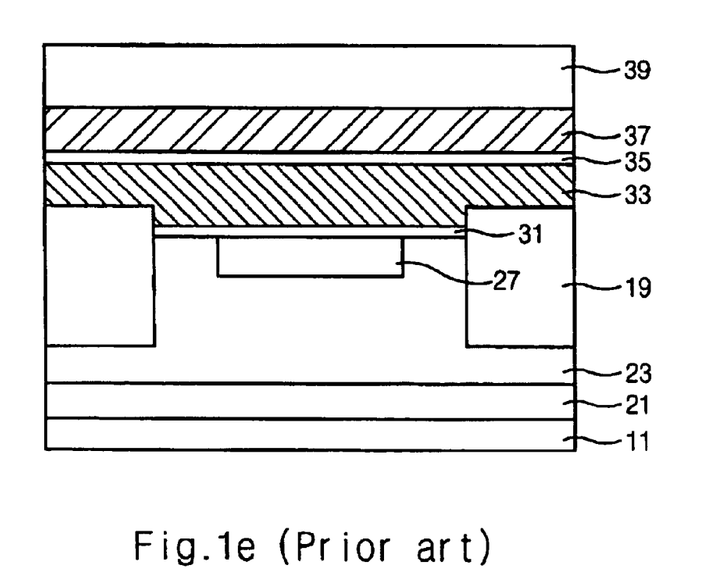

Now referring to FIG. 1e, the photoresist film pattern 29 and the buffer oxide film 25 are sequentially removed. A gate oxide film 31 is then formed on a surface of the semiconductor substrate 11. Next, a stacked structure of a polysilicon film 33 for gate electrode, a tungsten nitride barrier film 35, a tungsten film 37 for gate electrode and a hard mask film 39 is formed on the gate oxide film 31.

Thereafter, the stacked structure is patterned via a photoetching process using a gate electrode mask (not shown) to form a gate electrode (not shown).

In accordance with the conventional method for manufacturing semiconductor device, the misalignment of the photoresist film pattern used as a channel implant mask during the channel implant process causes variation of the concentration of the active region, resulting in generation of short channel effect and degradation of delay retention characteristics.

SUMMARY OF THE INVENTION

Accordingly, it is an object of the present invention to provide a method for manufacturing alignment mark of semiconductor device wherein a channel implant process is performed in a self-aligned manner without using an implant mask to prevent misalignment of the channel implant mask and to improve a refresh characteristic of the device.

In order to achieve the above-described object of the invention, there is provided a method for manufacturing semiconductor device, the method comprising the steps of: forming a device isolation film defining an active region on a semiconductor substrate, the device isolation film extruding upward higher than the active region; forming a buffer oxide film on the active region; subjecting the active region to a tilt ion implant process for implanting a impurity into the active region from two directions using the device isolation film as a mask so that a impurity concentration of the active region adjacent to the device isolation film is one half of that of the active region between the active region adjacent to the device isolation film; removing the buffer oxide film; and forming a stacked structure of a gate oxide film and a gate electrode on the active region.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing of semiconductor device in accordance with preferred embodiments of the present invention will now be described in detail with reference to the accompanying drawings.

FIGS. 2a through 2h are cross-sectional diagrams illustrating a method for manufacturing semiconductor device in accordance with a first preferred embodiment of the present invention.

Figure 2A:
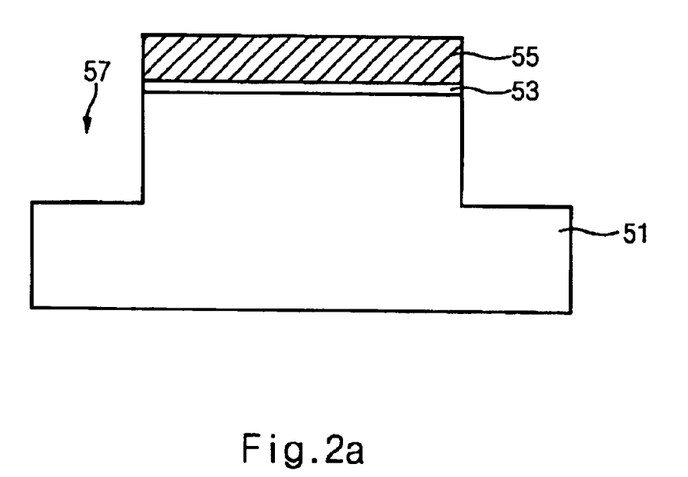
FIGS. 2a through 2h are cross-sectional diagrams illustrating a method for manufacturing semiconductor device in accordance with a first preferred embodiment of the present invention.

Referring to FIG. 2a, a pad oxide film 53 and a pad nitride film 55 are sequentially formed on a semiconductor substrate 51 such as a silicon wafer. Preferably, the pad oxide film 53 has a thickness ranging from 3 to 20 nm and the pad nitride film 55 has a thickness ranging from 30 to 200 nm.

Thereafter, the pad nitride film 55, the pad oxide film 53 and a predetermined thickness of the semiconductor substrate 51 are etched via a photoetching process using a device isolation film mask (not shown) to form a trench 57. Preferably, the trench 57 has a depth ranging from 100 to 400 nm.

Figure 2B:
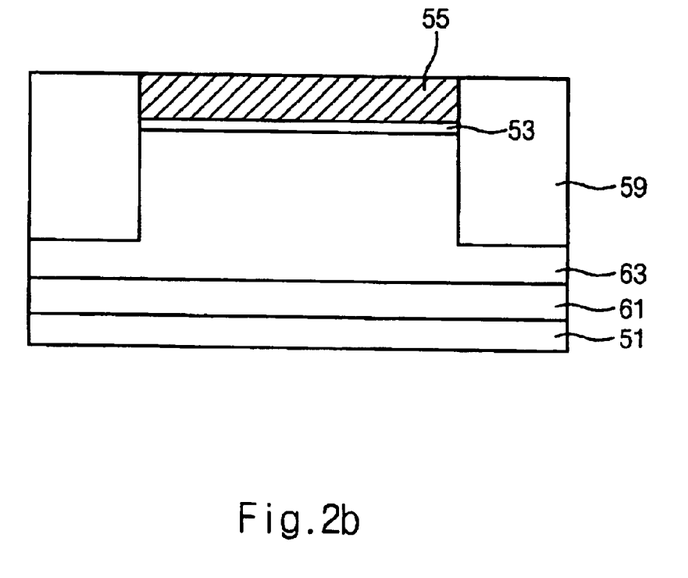

Now referring to FIG. 2b, a device isolation film 59 filling the trench 57 is formed. Preferably, the formation process of the device isolation film 59 comprises depositing and planarizing an oxide film for device isolation film (not shown) filling the trench 57.

Thereafter, a deep n-well 61 is formed via an implant process using an n-well mask (not shown). A p-well 53 is formed in the deep n-well 51 via an implant process using a p-well mask (not shown). Preferably, the formation process of the deep n-well 61 comprises implanting n-type impurity with an energy ranging from 500 KeV to 4 MeV, and the formation process of the p-well 53 comprises implanting p-type impurity one or more times with an energy ranging from 5 KeV to 4 MeV.

Figure 2C:
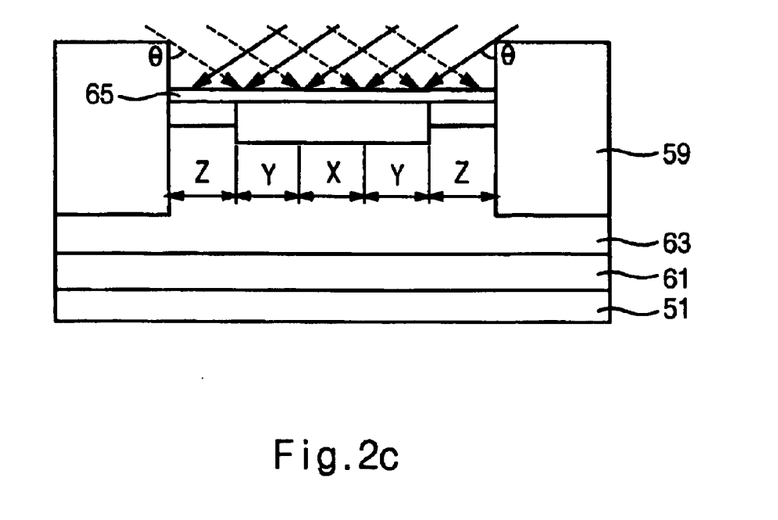
Figure 2D:
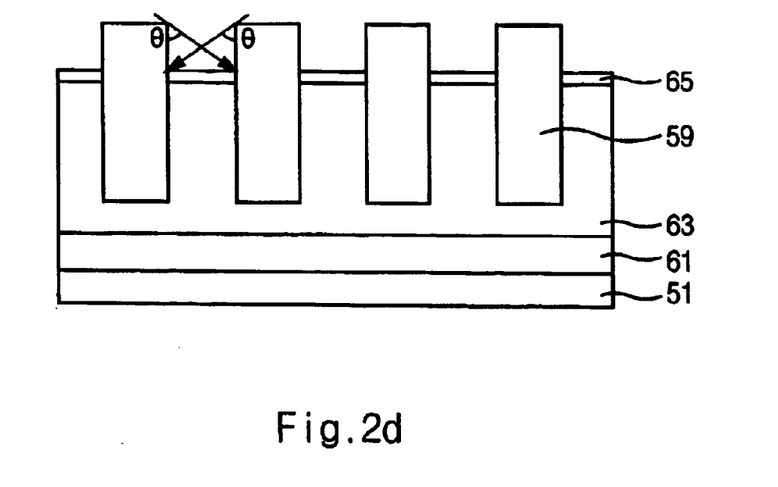

Referring to FIGS. 2c and 2d, the pad nitride film 55 and the pad oxide film 53 are removed preferably via a wet etching process. The step difference between the device isolation film 59 and the semiconductor substrate 51 after removing the pad nitride film 55 and the pad oxide film 53 ranges from 30 to 200 nm.

The active region between the device isolation films 59 comprises a bit line contact region X, a channel region Y and a storage electrode contact region Z. The storage electrode contact region Z resides at both sides of the bit line contact region X, and the channel region Y resides therebetween.

Thereafter, a buffer oxide film 65, preferably having a thickness ranging from 3 to 20 nm, is formed on the active region of the semiconductor substrate 51.

Next, the active region is subjected to a channel implant process comprising a tilt ion implant process using the device isolation film 59 as a mask.

The channel implant process comprises a tilt ion implant process performed from two directions in a self-aligned manner without using any photoresist pattern serving as a mask. That is, when the tilt ion implant process is performed in a direction of arrow shown in dotted lines, an impurity is not implanted in the region Z adjacent to the device isolation film 59 positioned at the left of the active region due to the device isolation film 49 serving as a mask. The impurity is implanted in the regions X and Y and region Z adjacent to the device isolation film 59 positioned at the right of the active region. When the tilt ion implant process is performed in a direction of arrow shown in solid lines, an impurity is not implanted in the region Z adjacent to the device isolation film 59 positioned at the right of the active region due to the device isolation film 49 serving as a mask. The impurity is implanted in the regions X and Y and region Z adjacent to the device isolation film 59 positioned at the left of the active region. Therefore, when the tilt implant process is performed from two directions as shown in FIG. 2c, the impurity is implanted once in the region Z and twice in the regions X and Y in total. As a result, the impurity concentrations of the regions X and Y are higher than that of the region Z by two times.

Preferably, the tilt angle $\theta$ of the tilt implant process with respect to a vertical sidewall of the device isolation film 59 ranges from 5 to 80° and the tilt implant process is performed with an energy ranging from 5 to 100 KeV and dose ranging from $1.0E12$ to $1.0E14/cm^2$.

FIG. 2d is a cross-sectional diagram illustrating a cross-section perpendicular to the cross-section shown in FIG. 2c. The tilt angle may be controlled so that the impurity is not implanted in the minor axis direction of the active region.

Figure 2E:
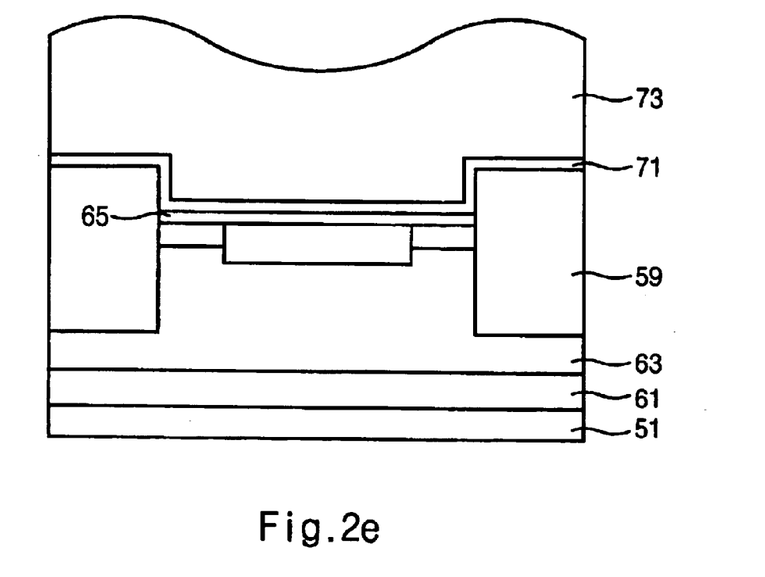

Now referring to FIG. 2e, a nitride film 71, preferably having a thickness ranging from 3 to 100 nm, is formed on the entire surface. Thereafter, a sacrificial oxide film 73, preferably having a thickness ranging from 50 to 500 nm, is deposited on the nitride film 71. The etch selectivity ratio of the sacrificial oxide film 73 to the device isolation film 59 preferably ranges from 1.1:1 to 2.0:1.

Figure 2F:
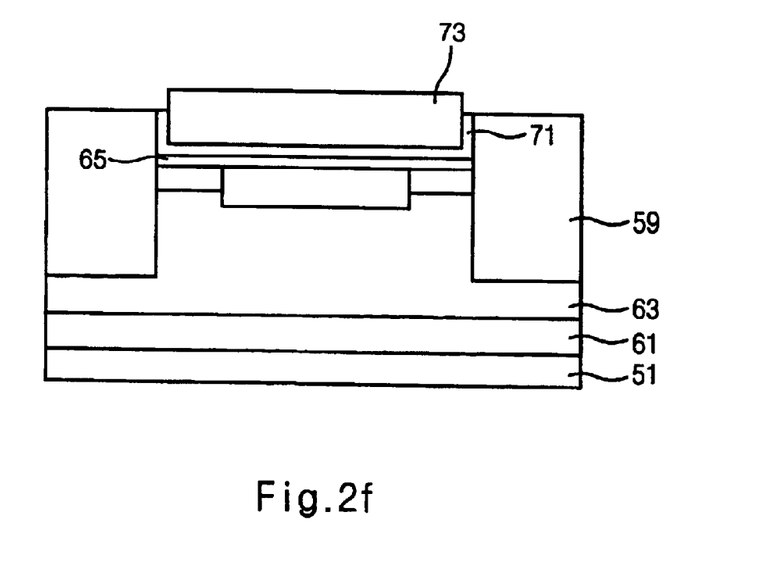

Next, the sacrificial oxide film 73 is planarized preferably via a CMP (Chemical Mechanical Polishing) process until a portion of the nitride film 71 on the device isolation film 59 is exposed.

Figure 2G:
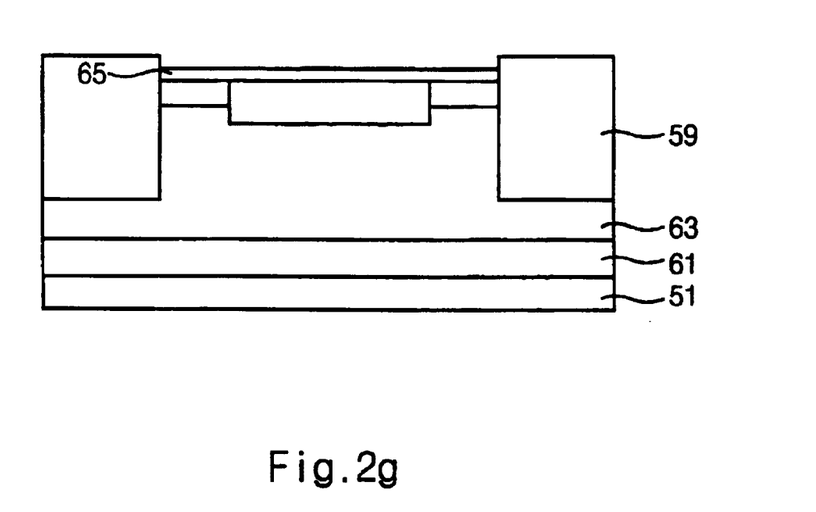

Referring to FIG. 2g, the sacrificial oxide film 73 is removed preferably via a wet etching process. A top portion of the device isolation film 59 is etched during the wet etching process.

Figure 2H:
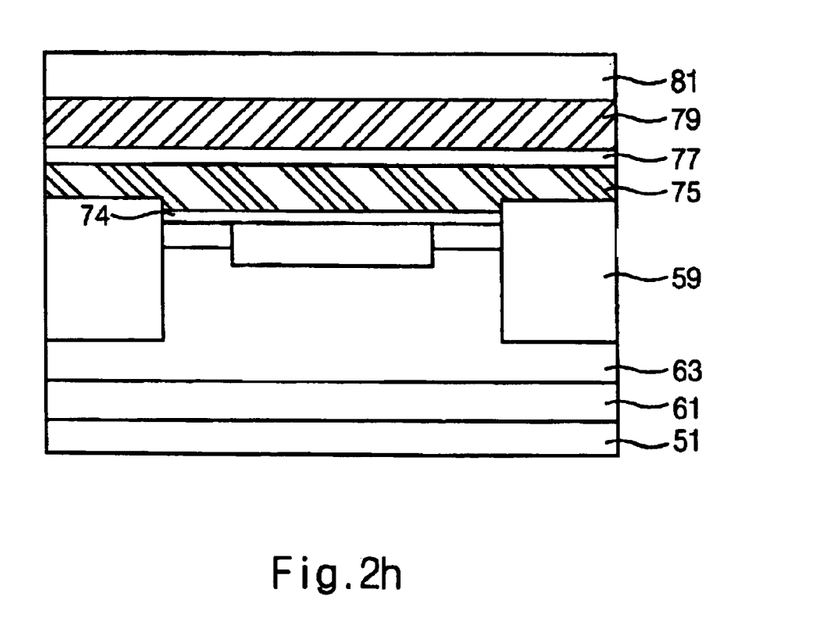

Now referring to FIG. 2h, the nitride film 71 and the buffer oxide film 65 are sequentially removed. A gate oxide film 74 is then formed on a surface of the semiconductor substrate 51. Next, a stacked structure of a polysilicon film 75 for gate electrode, a barrier film 77 for gate electrode, a metal film 79 for gate electrode and a hard mask film 81 is formed on the gate oxide film 74. Preferably, the gate oxide film has a thickness ranging from 3 to 10 nm, the polysilicon film 75 has a thickness ranging from 30 to 400 nm, the barrier film 77 has a thickness ranging from 3 to 10 nm, the metal film 79 has a thickness ranging from 30 to 150 nm, and the hard mask film 81 has a thickness ranging from 100 to 500 nm. The metal film 79 comprises a metal selected from a group consisting of metals having high melting points such as W, TiSix, WSix, TiN and MoSix. The barrier film 77 comprises a metal selected from a group consisting of WN, TiN, WSiN, TiSiN and WSix. A Wsix film may be used instead of the stacked structure of the barrier film 77 and the metal film 79.

Thereafter, the stacked structure is patterned via a photoetching process using a gate electrode mask (not shown) to form a gate electrode (not shown).

Figure 3A:
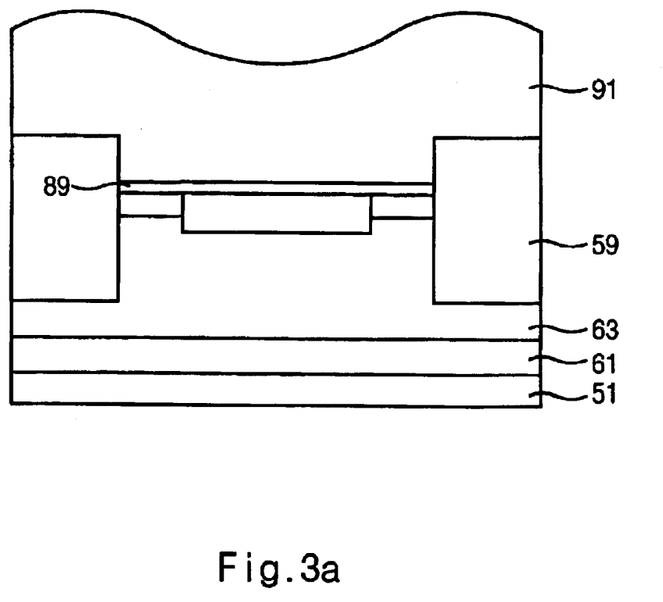
FIGS. 3a through 3c are cross-sectional diagrams illustrating a method for manufacturing semiconductor device in accordance with a second preferred embodiment of the present invention.
Figure 3B:
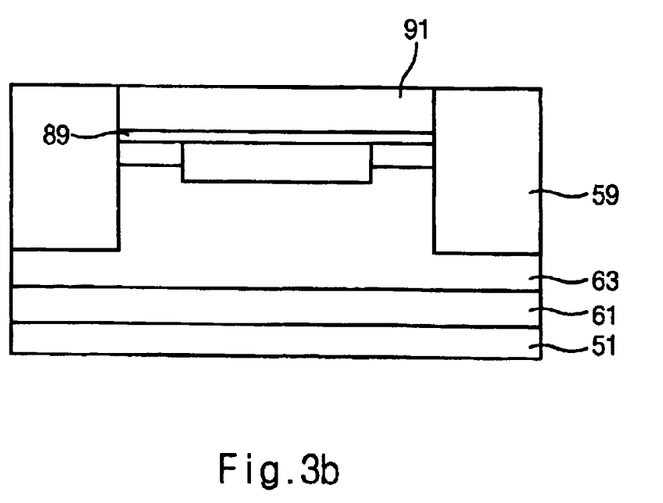
Figure 3C:
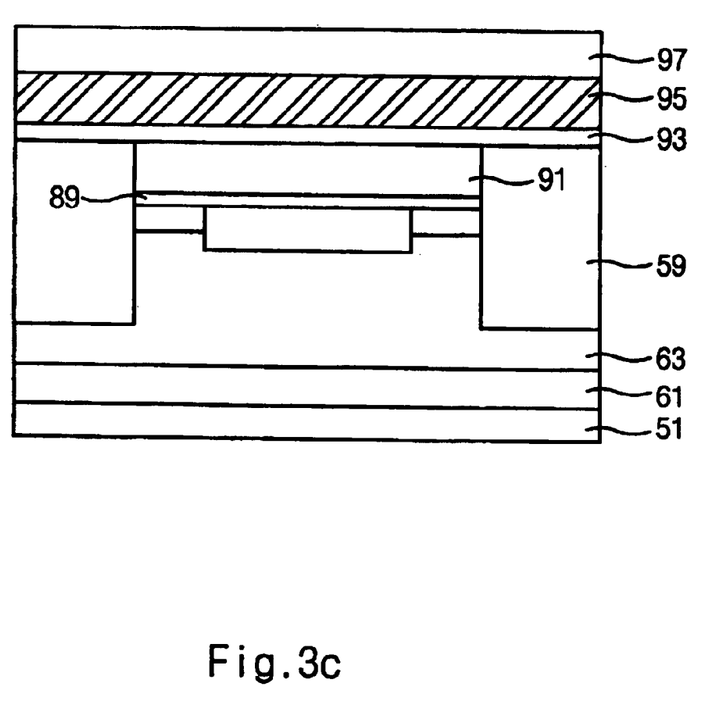

FIGS. 3a through 3c are cross-sectional diagrams illustrating a method for manufacturing semiconductor device in accordance with a second preferred embodiment of the present invention.

The processes shown in FIGS. 2a through 2c including the tilt ion implant process are performed to form a structure shown in FIG. 2c.

Referring to FIG. 3a, the buffer oxide film 65 of FIG. 2c is removed and a gate oxide film 89 is then formed on the active region of the semiconductor substrate 51. Thereafter, a polysilicon film 91 for gate electrode is formed on the entire surface of the structure to fill up the active region between the device isolation films 59. The thickness of a portion the polysilicon film 91 on the device isolation film 59 ranges from 100 to 400 nm.

Now referring to FIG. 3b, the polysilicon film 91 is planarized via a CMP process to expose a top surface of the device isolation film 59.

Referring to FIG. 3c, a barrier film 93 for gate electrode, a metal film 95 for gate electrode and a hard mask film 97 are deposited on the entire surface.

Thereafter, the hard mask film 97, the metal film 95, the barrier film 93, the polysilicon film 91 and the gate oxide film 89 are patterned via a photoetching process using a gate electrode mask (not shown) to form a gate electrode (not shown).

As discussed earlier, in accordance with the present invention, the channel implant process is performed in a self-aligned manner without using an implant mask. The device isolation film extruding upward higher than the active region serves as a mask during the tilt ion implant process so that the active region adjacent to the device isolation film is subjected to the ion implant process only once rather than twice as remainder portion of the active region. The self-aligned tilt implant process prevents misalignment of the channel implant mask and improves the refresh characteristic of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a semiconductor device, the method comprising the steps of:

forming a device isolation film defining an active region on a semiconductor substrate, the device isolation film extruding upward higher than the active region;

forming a buffer oxide film on the active region;

subjecting the active region to a tilt ion implant process for implanting an impurity into the active region from two directions using the device isolation in as a mask so that impurity concentrations of a storage electrode contact region adjacent to the device isolation film is one half of that of a bit line contact region and a channel region in the active region between the storage electrode contact region;

removing the buffer oxide film; and forming a stacked structure of a gate oxide film and a gate electrode on the active region.

2. The method according to claim 1, wherein the device isolation film extrudes upward higher than the active region by 30 to 200 nm.

3. The method according to claim 1, wherein the step of forming a device isolation film comprises:

(a) sequentially forming a pad oxide film and a pad nitride film on the semiconductor substrate;

(b) etching the pad nitride film, the pad oxide film and a predetermined depth of the semiconductor substrate to form a trench;

(c) forming the device isolation film filling the trench; and (d) removing the pad nitride film and the pad oxide film.

4. The method according to claim 3, wherein the of the pad oxide film ranges from 3 to 20 nm.

5. The method according to claim 3, wherein the thickness of the pad nitride film ranges from 30 to 200 nm.

6. The method according to claim 3, wherein the depth of the trench ranges from 100 to 400 nm.

7. The method according to claim 3, wherein the step (d) comprises a wet etching process.

8. The method according to claim 3, wherein the method further comprises, prior to performing step (d):

implanting an n-type impurity into the semiconductor substrate using an n-well mask to form an n-well; and implanting a p-type impurity into the semiconductor substrate using a p-well mask to form a p-well in the n-well.

9. The method according to claim 8, wherein the step of implanting an n-type impurity is performed with an energy ranging from 500 KeV to 4 MeV.

10. The method according to claim 8, wherein the step of implanting a p-type impurity is performed at least once with an energy ranging from 5 KeV to 4 MeV.

11. The method according to claim 1, wherein the thickness of the buffer oxide film ranges from 3 to 20 nm.

12. The method according to claim 1, wherein, prior to removing the buffer oxide film, the method further comprises:

(a) forming a nitride film on the entire surface;

(b) forming a sacrificial oxide film on the nitride film;

(c) planarizing the sacrificial oxide film to expose a portion of the nitride film on the device isolation film; and (d) removing the sacrificial oxide film and the exposed portion of the nitride film.

13. The method according to claim 12, wherein the thickness of the nitride film ranges from 3 to 100 nm.

14. The method according to claim 12, wherein the thickness of the sacrificial oxide film ranges from 50 to 500 nm.

15. The method according to claim 1, wherein the tilt ion implant process is performed with a tilt angle ranging from 8 to 80° with respect to a vertical side wall of the device isolation film, with an energy ranging from 5 to 100 KeV and a dose ranging from 1.0E12 to 1.0E14/cm$^2$.

16. The method according to claim 1, wherein the step of forming a stacked structure of a gate oxide film and a gate electrode comprises:

forming an oxide film on the active region;

forming a stacked structure of a polysilicon film, a barrier film, a metal film and a hard mask on the entire surface; and patterning the stacked structure of a polysilicon film, a barrier film, a metal film and a hard mask and the oxide film via a photoetching process using a gate electrode mask to form the gate oxide film and the gate electrode.

17. The method according to claim 1, wherein the step of forming a stacked structure of a gate oxide film and a gate electrode comprises:

forming an oxide film on the active region;

forming a polysilicon film on the entire surface;

planarizing the polysilicon film to expose a top portion of the device isolation film;

forming a stacked structure of a barrier film, a metal film and a hard mask on the entire surface, and patterning the stacked structure of a barrier film, a metal film and a hard mask and the oxide film, the polysilicon film and the oxide film via a photoetching process using a gate electrode mask to form the gate oxide film and the gate electrode.

18. The method according to claim 17, wherein the thickness of the polysilicon film ranges from 100 to 400 nm.

* * * * *